(12) United States Patent
Wilhelm von der Bey

(10) Patent No.: US 9,779,344 B2
(45) Date of Patent: Oct. 3, 2017

(54) OPTICALLY READABLE CODE AND METHOD OF MARKING PRINTED CIRCUIT BOARDS BY MEANS OF AN OPTICALLY READABLE CODE

(71) Applicant: TRW AUTOMOTIVE ELECTRONICS AND COMPONENTS GMBH, Radolfzell, DE (US)

(72) Inventor: Friedrich Wilhelm von der Bey, Orsingen-Nenzingen (DE)

(73) Assignee: TRW Automotive Electronics & Components GmbH (DE)

( * ) Notice: Subject to any disclaimer, the term of this patent is extended or adjusted under 35 U.S.C. 154(b) by 0 days.

(21) Appl. No.: 15/338,856

(22) Filed: Oct. 31, 2016

(65) Prior Publication Data

US 2017/0124440 A1    May 4, 2017

(30) Foreign Application Priority Data

Nov. 3, 2015    (DE) .......................... 10 2015 118 836

(51) Int. Cl.
*G06K 19/06*    (2006.01)
*G06F 17/50*    (2006.01)
*G06K 7/14*    (2006.01)

(52) U.S. Cl.
CPC ... *G06K 19/06037* (2013.01); *G06F 17/5068* (2013.01); *G06K 7/1417* (2013.01)

(58) Field of Classification Search
CPC ................ G06K 19/06037; G06K 7/14; G07F 17/5068; G07F 7/1008; B42D 15/10
USPC .................................................. 235/494, 487
See application file for complete search history.

(56) References Cited

U.S. PATENT DOCUMENTS 6,360,950 B1     3/2002  Hoover-Szendre
2005/0236176 A1*  10/2005  Hsu ...................... H05K 1/0266
                                                               174/250

OTHER PUBLICATIONS

CT Magazin for Computer Technik, 1996, vol. 3, p. 273.

* cited by examiner

*Primary Examiner* — Karl D Frech
(74) *Attorney, Agent, or Firm* — Tarolli, Sundheim, Covell & Tummino LLP

(57) ABSTRACT

A printed circuit board comprises an optically readable code with product information. The information is encoded in code locations which are distributed over the printed circuit board at different positions.

21 Claims, 3 Drawing Sheets

OPTICALLY READABLE CODE AND METHOD OF MARKING PRINTED CIRCUIT BOARDS BY MEANS OF AN OPTICALLY READABLE CODE

This application claims priority from German Patent Application No. 10 2015 118 836.8, filed Nov. 3, 2015, the subject matter of which is incorporated herein by reference.

BACKGROUND OF THE INVENTION

The invention relates to an optically readable code and to a method of marking printed circuit boards by means of an optically readable code.

Optically readable codas by which information is encrypted in symmetrical patterns or images in a compressed form are known. This type of code can be read out and decoded quickly and in an uncomplicated manner using simple scanner technologies.

The codes formerly used were almost exclusively one-dimensional codes, in particular so-called bar codes, in which the information is encoded in binary form in parallel bars of different widths.

More recently, two-dimensional codes are increasingly employed, which are structured, for example, in the form of a matrix or a grid and which, in terms of surface area, have a higher information density than one-dimensional codes. Known examples of two-dimensional codes include QR codes or DataMatrix codes.

The drawback of all these codes is that the resolution of the scanners is limited and, therefore, the codes must not be smaller than a specific minimum size. This results in that the codes can only be applied to sufficiently large surface areas and that the largest surface area available for marking limits the maximum amount of information that can be included in a code.

This limitation is a problem above all in the semiconductor industry since a unique identification of, for example, a printed circuit board solely on the baste of external features may be impossible later and therefore makes a marking absolutely necessary. Due to miniaturization, i.e. the tendency or effort made towards an ever decreasing accommodation space, the room available therefor is limited, especially in the case of printed circuit boards.

SUMMARY OF THE INVENTION

The object of the invention is to provide a coding the maximum information content of which is not restricted by the largest surface area available for marking and which, in particulars suitable for the marking of printed circuit boards.

To achieve the object provision is made for an optically readable code for marking printed circuit boards with product information, the information being encoded in code locations which are distributed over the printed circuit board at different positions, preferably on one side of the printed circuit board. Preferably, all of the positions are situated at one level of height here. But it is also possible to distribute the positions to different levels of height, as long as all code locations necessary for decoding can be detected or acquired in a two-dimensional image. In this connection, it may be necessary, as from a particular difference in level, to adjust the size of the code locations for them to be uniquely identified by the detection system. As an alternative, the detection system is able to recognize differences of level and make a correction electronically. The advantage of this arrangement of the code locations is that the amount of information that can be accommodated in a code is not limited by the largest free individual surface that is available for marking, but by the sum of all suitable individual surfaces that can be depicted in a two-dimensional image. This allows also the utilization of non-contiguous, free individual surfaces as occur, e.g., on printed circuit boards for production-related reasons, for marking the printed circuit boards with an optically readable code which preferably contains all of the product information desired.

The positions are situated, for example, on free areas available for marking, and the code locations more particularly do not form a superordinate symmetrical pattern. Here, the code locations are no longer bound to any predefined general structure or pattern and can be distributed to various different suitable positions over the printed circuit board. In this way, the surface area available for marking and hence, the amount of coded information can be maximized.

In a preferred embodiment, the code locations are distinct from their surroundings by a difference in contrast. A sufficiently large difference in contrast is simple to detect and, in addition, does not make any major demands on the detection system.

The difference in contrast may be produced in particular by resist removal and/or by oxidation of the printed circuit board surface. This allows an efficient and cost-effective application of the code locations. More particularly, the printed circuit board may be marked directly in a process step which includes this type of surface treatment anyway, which minimizes the additional time required for the marking.

Preferably, the code is binary, and there is a contrast threshold value which is made use of for distinction of the bits. Using only one contrast threshold value makes it easier for the detection system to recognize and analyze the code. This allows the time needed for decoding to be reduced, and also allows detection systems which have a simple structure and are therefore lower-priced to be used for decoding.

The code may also be higher-level and comprise a plurality of contrast threshold values which are utilized for differentiation of the values of the code locations. In this way, each code location can assume not only one of two, but one out of many values, namely the number of the contrast threshold values +1. This allows the information density to be greatly increased, which makes it possible to accommodate more information on a specified surface area or a specified information on less surface area.

In a further advantageous configuration, the code locations may differ from their surroundings by their electromagnetic spectrum, and the coding may be effected by way of different wavelength ranges or spectra. This allows the code locations to be identified by way of their respective color or spectrum, and the number of possible values which a code location can assume is greatly increased in comparison with contrast threshold values.

Preferably, the printed circuit board has a reference, more particularly a contrast level reference which allows a calibration of a detection system, in this way decoding errors are avoided and the decoding time can be reduced.

It is of advantage if the code includes at least one localization symbol and/or if a unique assignment of the code locations is possible by the arrangement of the positions of the code locations. Localization symbols make it easier for the detection system to recognize the code and to assign the code locations. This may also be effected by the unique assignment of the code locations based on the arrangement of the positions of the code locations, for example in a pattern. As an alternative, it is also possible to make use of the position of the printed circuit board and/or of further components which are firmly connected to the printed circuit board for an assignment of the code locations if they permit a unique assignment based on their shape and/or arrangement. Each of these features allows the code to be identified faster and to be decoded without error.

The code may comprise check encodings and/or redundancies, which allow an automatic error correction, thereby accelerating an error-free decoding of the code.

To achieve the above-mentioned object, according to the invention provision is also made for a method of marking printed circuit boards with product information by means of an optically readable code, including the steps of:

a) establishing the code, preferably by means of an E-CAD system, the positions of the code locations preferably being created as a freely defined, preferably invisible component in the E-CAD system, and b) applying the code onto the printed circuit board.

The information of any desired existing cede, preferably an "ECC200 DataMatrix" code, may be distributed to code locations at different positions on the printed circuit board, an assignment table for a unique decoding being used. This allows the surface of the existing code to be split up, as it were, and to be distributed to different positions on a printed circuit board by the Information of the existing code being mapped by code locations on the printed circuit board, in this connection, for example, the number of code locations on the printed circuit board and their arrangement relative to each other may correspond to the number of code locations on the pattern of the existing code and their arrangement relative to each other. More particularly, however, both the number of code locations and their arrangement relative to each other on the printed circuit board may be completely independent of the arrangement of the code locations of the existing code. In order to ensure a unique and quick decoding, an assignment table is used in this case.

The method preferably comprises the steps of:
1. determining free areas available for marking, preferably by means of an E-CAD system, and
2. allocating the code locations to the free areas available for marking, preferably by means of an E-CAD system, more particularly wherein a number of code locations are allocated as a function of the size of a free area.

In this way, it is possible to determine the code that is best suited for marking an existing printed circuit board with a specific information. To determine the best code, various parameters may be used in the evaluation, for example how easily the code locations can be detected by a detection system or how expensive the application of the code locations is. More particularly, the free areas as well as the best code may be automatically determined by an E-CAD system which calculates the best code based on various parameters.

BRIEF DESCRIPTION OF THE DRAWINGS

Further advantages and features will be apparent from the description below in conjunction with the accompanying drawings, in which.

DESCRIPTION

Figure 1:
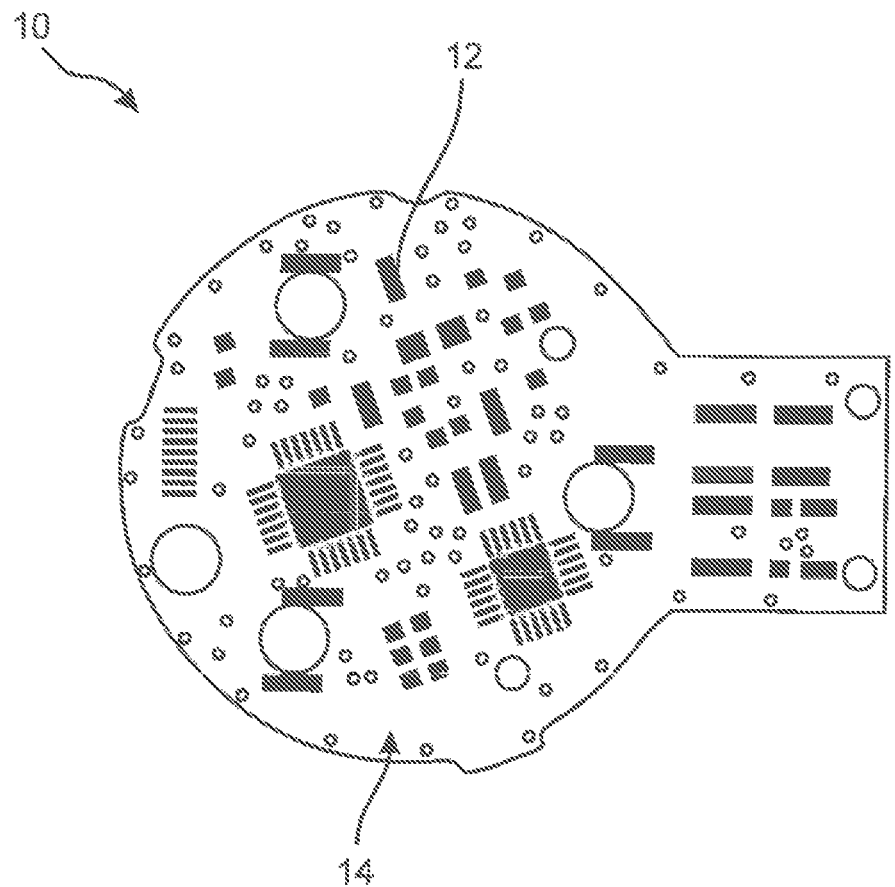
FIG. 1 shows a top view of a printed circuit board without a code.

FIG. 1 shows a top view of a printed circuit board 10. The printed circuit board 10 has a large number of different electronic components 12 arranged thereon, between which there are only a few free areas 14 which are available for marking the printed circuit board 10.

Figure 2:
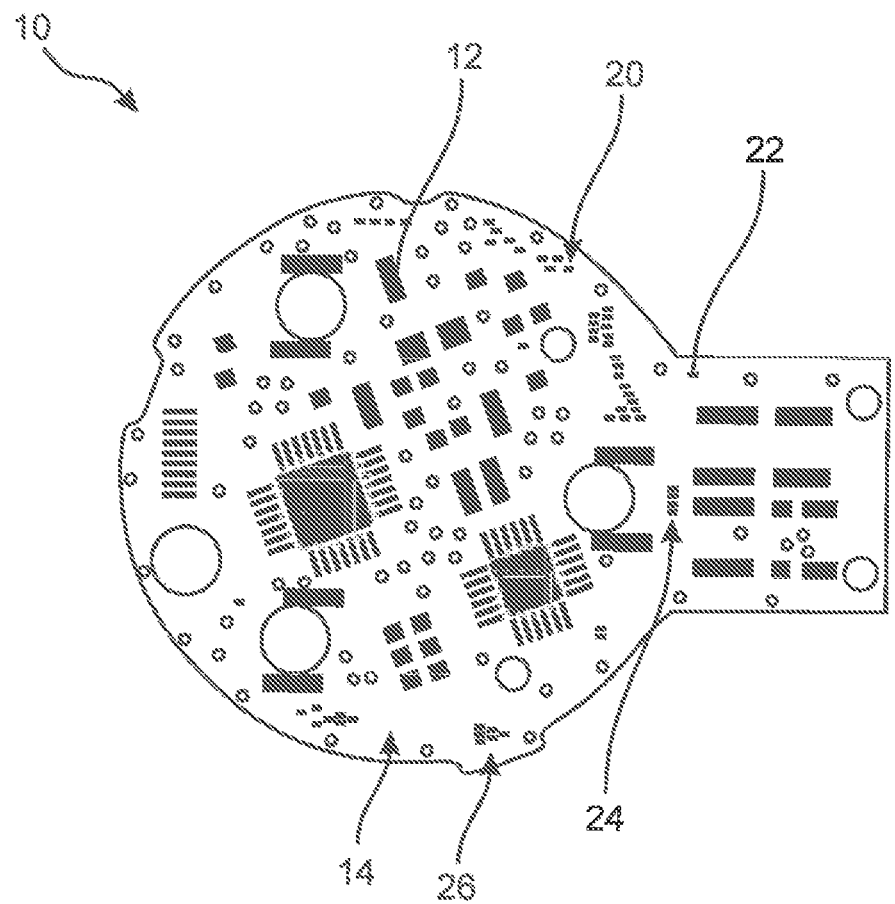
FIG. 2 shows a top view of the printed circuit board of FIG. 1 with an optically readable code according to the Invention.
Figure 3:
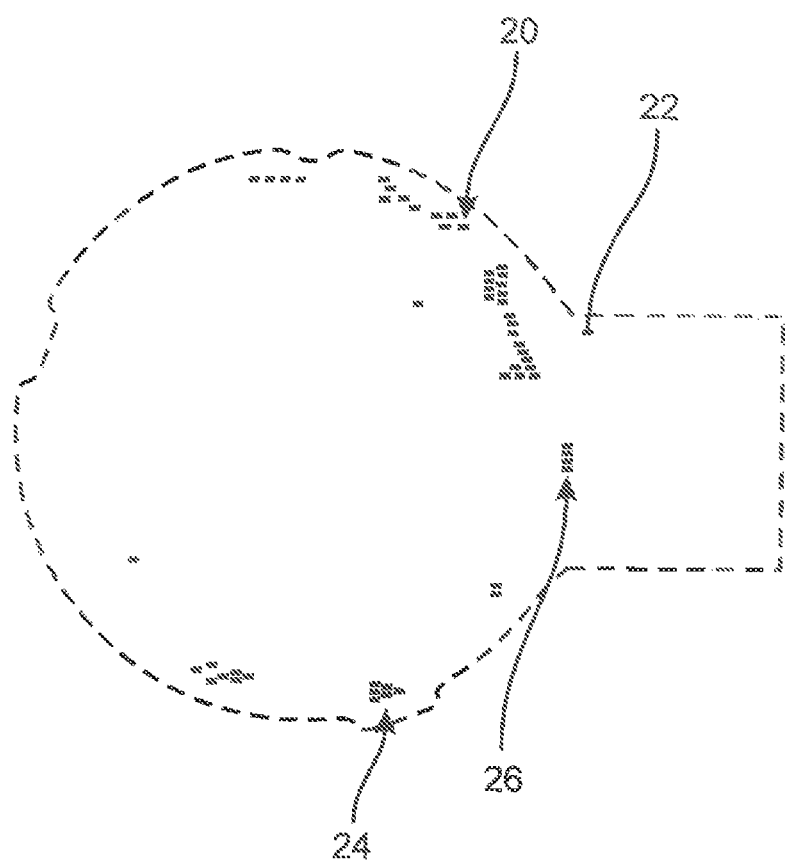
FIG. 3 shows the isolated, optically readable code according to the Invention of FIG. 2.

FIG. 2 shows the printed circuit board 10 of FIG. 1 which was marked with an optically readable code 20. Reference is also made in this regard to FIG. 3, which shows the isolated code 20. The optically readable code 20 is formed of individual code locations 22 which were applied at different positions onto the free areas 14 the printed circuit board 10.

The positions of the code locations 22 here are confined to free areas 14 that are available for marking and are not bound to a superordinate symmetrical pattern.

However, a superordinate pattern or a system for arranging the individual code locations 22 can be utilized to make the encoding and decoding of the optically readable code 20 more efficient.

The code locations 22 have a uniform shape, size, and orientation, and are all situated at the same level of height of the printed circuit board 10. The uniform shape, size, and orientation of the code locations 22 is not absolutely necessary, but facilitates the identification and decoding of the code 20.

Alternatively, at least part of the code locations 22 may also be applied at different levels of height, in particular also to suitable surfaces on the electronic components 12, or also to further components which are firmly connected with the printed circuit board 10, for example to package elements. In this case, it would even be convenient to adapt the size of the code locations 22 when the differences in the levels of height are especially large, in order to compensate for a perspective-induced difference in size of the code locations 22.

In a two-dimensional detection system it is furthermore required that all code locations 22 necessary for decoding are arranged such that they can be detected or acquired in a two-dimensional image.

The code locations 22 are distinguished from their immediate surroundings by a difference in contrast and can thus be easily identified by a detection system.

The difference in contrast is obtained by resist removal and/or oxidation of the surface of the printed circuit board 10 and in this way allows a cost-effective and durable marking. As an alternative, the code may also be printed on.

The code 20 is binary here, and a fixed contrast threshold value is made use of for setting the values of the code locations 22.

The code 22 may also be configured to be higher-level by making use of a plurality of contrast threshold values which allow more than 2 different values to be assigned to the code locations 22. This allows the information density of the code 22 to be greatly increased.

In place of or additionally to the contrast values, the code locations 22 can also differ from their surroundings by their electromagnetic spectrum. This allows the coding to be effected by way of different wavelength ranges or spectra and to be either binary or also configured to be higher-level.

In particular, lamps and/or fluorescent substances emitting light in a highly limited wavelength range may be used to highlight the code 20 and to make detection easier for a detection system.

The printed circuit board 10 has a reference 24 which allows a calibration of a detection system. In particular in the case of higher-level codes 22 with a plurality of contrast levels, a contrast level reference will improve the accuracy and speed of a decoding process.

In an alternative embodiment, the encoding of the code locations 22 may also be performed by using their shapes and/or orientations.

The code 20 includes a localization symbol 26 which here is formed by six individual code locations 22 which are arranged in a triangle. The position and orientation of the triangle may serve for a detection system to orient itself while the size of the triangle may be used for the scaling. Generally, however, the localization symbol 26 is not limited to triangles and may assume any suitable shape and size.

In place of or additionally to localization symbols, the arrangement of the positions of the code locations 22 may allow a unique assignment of the code locations 22.

The code 20 may comprise check encodings and/or redundancies which allow an error correction. For this purpose, for example, additional code locations 22 may be used, or the information required therefor is coded in the arrangement and/or the position of the code locations 22.

For marking printed circuit boards 10 with product information by means of an optically readable code 20, the code first has to be established before applying it onto the printed circuit board 10.

The code 20 is preferably established by means of an E-CAD system, e.g. a PCB (printed circuit board) design software, with the positions of the code locations 22 being created as a freely defined, invisible, i.e. virtual, component in the E-CAD system.

The positions of the code locations 22 may be selected manually or with the aid of a function of the E-CAD system, for example the "auto-placement" function.

The code 20 can be created for circuit boards 10 with a predefined layout of the electronic components 12. As an alternative, the code 20 may be pad of the design process of the circuit board 10 and more particularly influence the layout of the electronic components 12.

Creating a circuit board 10 with a code 20 can comprise the following steps:
a) arranging the electronic components 12 on a predefined circuit board 10 by using the "auto-placement" function of the E-CAD system,
b) determining the free areas 14 available for marking by means of the E-CAD system, more particularly wherein the free areas 14 available for marking comprise insulation zones that are provided between the electric components 12 for electric insulation,
c) determining the code 20 which is most suitable for marking the circuit board 10 with a specific information by means of the E-CAD system, more particularly wherein the detectability of the code 20 by a detection system and the cost of the application of the code 20 are taken into account in this evaluation, and wherein the code locations 22 are allocated to free areas 14 available for marking by allocating a number of code locations 22 as a function of the size of a free area 14,
d) defining a virtual component representing the code 20, and
e) positioning the virtual component on the circuit board 10.

By means of this encoding, existing codes, for example "ECC200 DataMatrix" codes, can also be transferred to printed circuit boards 10 on which they would normally not find sufficient space. To this end, the code locations of the existing code are distributed to code locations 22 at different positions on the printed circuit board 10, with an assignment table for a unique decoding being used.

For decoding the code 20, known methods and suitable detection systems are used. The methods may more particularly comprise the following steps here:
(a) identifying the localization symbols 28, code locations 22, and references 24 on an image;
(b) calibrating the detection system;
(c) determining whether the image comprises all code locations 22 which are necessary for decoding;
(d) evaluating the code locations 22;
(e) decoding the information; and
(f) verifying the information with the aid of check encodings and redundancies.

The invention claimed is:

1. An optically readable code for marking printed circuit boards with product information, the information being encoded in code locations which are distributed over the printed circuit board at different positions on non-contiguous surfaces.

2. The optically readable code of claim 1 wherein the code is provided on only one side of the printed circuit board.

3. The optically readable code of claim 1 wherein the positions are situated on free areas available for marking.

4. The optically readable code of claim 3 wherein the code locations do not form a superordinate symmetrical pattern.

5. The optically readable code of claim 1 wherein the code locations are distinct from their surroundings by a difference in contrast.

6. The optically readable code of claim 5 wherein the difference in contrast is produced by resist removal and/or by oxidation of the printed circuit board surface.

7. The optically readable code of claim 1 wherein the code is binary and that there is a contrast threshold value.

8. The optically readable code of claim 1 wherein the code is higher-level and wherein there is a plurality of contrast threshold values.

9. The optically readable code of claim 1 wherein the code locations differ from their surroundings by their electromagnetic spectrum and the coding is effected by way of different wavelength ranges or spectra.

10. The optically readable code of claim 1 wherein the printed circuit board has a reference.

11. The optically readably code of claim 10 wherein a contrast level reference is present which allows a calibration of a detection system.

12. The optically readable code of claim 1 wherein the code includes at least one localization symbol and/or that a unique assignment of the code locations is possible by the arrangement of the positions of the code locations.

13. The optically readable code of claim 1 wherein the code comprises check encodings and/or redundancies.

14. A printed circuit board comprising the optically readable code as defined in claim 1.

15. The optically readable code of claim 1 wherein the non-contiguous surfaces are separated by at least one electrical component.

16. The optically readable code of claim 1 wherein the code is an existing ECC200 Data Matrix code, the ECC200 Data Matrix code being split up into a plurality of surface portions, each of the surface portions being encoded in one of the code locations.

17. A method of marking printed circuit boards with product information by means of an optically readable code according to claim 1, comprising the steps of:
establishing the code, preferably by means of an E-CAD system, the positions of the code locations preferably being created as a freely defined, preferably invisible component in the E-CAD system, and applying and distributing the code onto the printed circuit board at different positions on non-contiguous surfaces.

18. The method of claim 17 wherein the information of any desired existing code, preferably an "ECC200 DataMatrix" code, is distributed to code locations at different positions on the printed circuit board, wherein an assignment table for a unique decoding is used.

19. The method of claim 17 wherein the method comprises the steps of:
   a) determining free areas available for marking, preferably by means of an E-CAD system, and
   b) allocating the code locations to the free areas available for marking, preferably by means of an E-CAD system, more particularly wherein a number of code locations are allocated as a function of the size of a free area.

20. An optically readable code for marking printed circuit boards with product information, the information being encoded in code locations which are distributed over the printed circuit board at different positions on non-contiguous surfaces, wherein the code includes at least one localization symbol and/or that a unique assignment of the code locations is possible by the arrangement of the positions of the code locations.

21. The optically readable code of claim 20 wherein the unique assignment of the code locations is provided by an assignment table.

* * * * *